(12) United States Patent
Cheng et al.

(10) Patent No.: US 10,600,381 B2
(45) Date of Patent: Mar. 24, 2020

(54) RESET CONTROL CIRCUIT, METHOD FOR DRIVING THE SAME, SHIFT REGISTER CIRCUIT, AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Xuelian Cheng, Beijing (CN); Xuehuan Feng, Beijing (CN); Qi Hu, Beijing (CN); Pan Xu, Beijing (CN); Yongqian Li, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 16/014,667

(22) Filed: Jun. 21, 2018

(65) Prior Publication Data

US 2019/0088226 A1 Mar. 21, 2019

(30) Foreign Application Priority Data

Sep. 20, 2017 (CN) .......................... 2017 1 0854372

(51) Int. Cl.
*G09G 3/36* (2006.01)
*G11C 19/28* (2006.01)
*G09G 3/20* (2006.01)

(52) U.S. Cl.
CPC ............. *G09G 3/3677* (2013.01); *G09G 3/20* (2013.01); *G09G 3/3622* (2013.01); *G11C 19/28* (2013.01); *G09G 2310/0267* (2013.01); *G09G 2310/0286* (2013.01)

(58) Field of Classification Search
CPC ....... G09G 3/3677; G09G 3/20; G09G 3/3622
USPC ........................ 377/64, 68; 345/204, 100, 55
See application file for complete search history.

(56) References Cited

U.S. PATENT DOCUMENTS

2014/0093027 A1* 4/2014 Jang ...................... G11C 5/005
377/64

* cited by examiner

*Primary Examiner* — Tomi Skibinski
(74) *Attorney, Agent, or Firm* — Arent Fox LLP; Michael Fainberg (57) ABSTRACT

A reset control circuit, a method for driving the same, a shift register circuit, and a display device are disclosed. The reset control circuit includes: a reset-off sub-circuit, a reset-on sub-circuit, and a general output terminal; a signal to be shifted is input to a first control terminal of the reset-off sub-circuit, a reset-off signal is input to a first input terminal thereof; a shift signal is input to a second control terminal of the reset-on sub-circuit, the signal to be shifted is input to a third control terminal thereof, the shift signal reused as a reset-on signal is input to a second input terminal thereof; with a pulse level of the signal to be shifted, the reset-off sub-circuit is controlled to be enabled to output the reset-off signal to the general output terminal, the reset-on sub-circuit is controlled to be disabled to stop the reset-on signal from being output.

9 Claims, 5 Drawing Sheets

RESET CONTROL CIRCUIT, METHOD FOR DRIVING THE SAME, SHIFT REGISTER CIRCUIT, AND DISPLAY DEVICE

CROSS-REFERENCE TO RELATED APPLICATION

This Application claims priority to Chinese Patent Application No. 201710854372.4, filed on Sep. 20, 2017, the content of which is incorporated by reference in the entirety.

TECHNICAL FIELD

This disclosure relates to the field of display technologies, and particularly to a reset control circuit, a method for driving the same, a shift register circuit, and a display device.

DESCRIPTION OF RELATED ART

In the field of display technologies, a design of a gate drive circuit generally includes two signals, i.e., a signal to be shifted, and a shift signal, and typically there is mutual interference between the two signals, where there is interference of the shift signal to the signal to be shifted.

SUMMARY

Embodiments of the disclosure provide a reset control circuit, a method for driving the same, a shift register circuit, and a display device.

In an aspect, the embodiments of the disclosure provide a reset control circuit including: a reset-off sub-circuit, a reset-on sub-circuit, and a general output terminal, wherein: the reset-off sub-circuit includes a first control terminal, a first input terminal, and a first output terminal, and the reset-on sub-circuit includes a second control terminal, a third control terminal, a second input terminal, and a second output terminal; the first output terminal and the second output terminal are connected respectively with the general output terminal, a signal to be shifted is input respectively to the first control terminal and the third control terminal, a reset-off signal is input to the first input terminal, a shift signal is input to the second control terminal, and the shift signal reused as a reset-on signal is input to the second input terminal; the reset-off sub-circuit is configured to output the reset-off signal to the general output terminal under control of a pulse level of the signal to be shifted; and the reset-on sub-circuit is configured to stop the reset-on signal from being output, under the control of the pulse level of the signal to be shifted.

In some embodiments, the reset-off sub-circuit is further configured to stop the reset-off signal from being output, under control of a non-pulse level of the signal to be shifted.

In some embodiments, the reset-on sub-circuit is further configured to output the reset-on signal to the general output terminal under control of both a non-pulse level of the signal to be shifted, and a pulse level of the shift signal.

In some embodiments, the reset-off sub-circuit includes a first transistor; wherein a gate of the first transistor is connected with the first control terminal, a drain of the first transistor is connected with the first input terminal, and a source of the first transistor is connected with the first output terminal.

In some embodiments, the reset-on sub-circuit includes a second transistor and a third transistor; wherein a gate of the second transistor is connected with the second control terminal, a drain of the second transistor is connected with the second input terminal, and a source of the second transistor is connected with a drain of the third transistor, and a gate of the third transistor is connected with the third control terminal, and a source of the third transistor is connected with the second output terminal.

In some embodiments, the reset-on sub-circuit includes a second transistor and a third transistor; wherein a gate of the second transistor is connected with a source of the third transistor, a drain of the second transistor is connected with the second input terminal, and a source of the second transistor is connected with the second output terminal, and a gate of the third transistor is connected with the third control terminal, a drain of the third transistor is connected with the second input terminal, and the source of the third transistor is the second control terminal.

In another aspect, the embodiments of the disclosure further provide a shift register circuit including: an input control circuit, an input circuit, an output circuit, a reset circuit, a level maintenance circuit, and a reset control circuit, wherein: the input circuit is configured to set a reset node to an output-on signal under control of the input control circuit to enable the output circuit; the reset circuit is configured to set the reset node to an output-off signal under control of the reset control circuit to disable the output circuit; and the level maintenance circuit is configured to maintain a level at a node where the input control circuit is connected with the input circuit when both the input circuit and the reset circuit are disabled; wherein the reset control circuit includes a reset-off sub-circuit, a reset-on sub-circuit, and a general output terminal, wherein the reset-off sub-circuit includes a first control terminal, a first input terminal, and a first output terminal, and the reset-on sub-circuit includes a second control terminal, a third control terminal, a second input terminal, and a second output terminal; the first output terminal and the second output terminal are connected respectively with the general output terminal, a signal to be shifted is input respectively to the first control terminal and the third control terminal, a reset-off signal is input to the first input terminal, a shift signal is input to the second control terminal, and the shift signal reused as a reset-on signal is input to the second input terminal; the reset-off sub-circuit is configured to output the reset-off signal to the general output terminal under control of a pulse level of the signal to be shifted; and the reset-on sub-circuit is configured to stop the reset-on signal from being output, under the control of the pulse level of the signal to be shifted.

In some embodiments, the reset-off sub-circuit is further configured to stop the reset-off signal from being output, under control of a non-pulse level of the signal to be shifted.

In some embodiments, the reset-on sub-circuit is further configured to output the reset-on signal to the general output terminal under control of both a non-pulse level of the signal to be shifted, and a pulse level of the shift signal.

In some embodiments, the reset-off sub-circuit includes a first transistor; wherein a gate of the first transistor is connected with the first control terminal, a drain of the first transistor is connected with the first input terminal, and a source of the first transistor is connected with the first output terminal.

In some embodiments, the reset-on sub-circuit includes a second transistor and a third transistor; wherein a gate of the second transistor is connected with the second control terminal, a drain of the second transistor is connected with the second input terminal, and a source of the second transistor is connected with a drain of the third transistor, and a gate of the third transistor is connected with the third control terminal, and a source of the third transistor is connected with the second output terminal.

In some embodiments, the reset-on sub-circuit includes a second transistor and a third transistor; wherein a gate of the second transistor is connected with a source of the third transistor, a drain of the second transistor is connected with the second input terminal, and a source of the second transistor is connected with the second output terminal, and a gate of the third transistor is connected with the third control terminal, a drain of the third transistor is connected with the second input terminal, and the source of the third transistor is the second control terminal.

In still another aspect, the embodiments of the disclosure further provide a display device including the shift register circuit above according to the embodiments of the disclosure.

In a further aspect, the embodiments of the disclosure further provide a method for driving the reset control circuit above according to the embodiments of the disclosure, the method including: enabling the reset-off sub-circuit under the control of the pulse level of the signal to be shifted, input to the first control terminal; disabling the reset-on sub-circuit under the control of the pulse level of the signal to be shifted, input to the third control terminal; and outputting the reset-off signal input to the first input terminal of the reset-off sub-circuit to the general output terminal of the reset control circuit.

In some embodiments, the method further includes: disabling the reset-off sub-circuit under control of a non-pulse level of the signal to be shifted, input to the first control terminal; enabling the reset-on sub-circuit under control of both a pulse level of the shift signal input to the second control terminal, and the non-pulse level of the signal to be shifted, input to the third control terminal; and outputting the reset-on signal input to the second input terminal of the reset-on sub-circuit to the general output terminal of the reset control circuit.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

Figure 1:
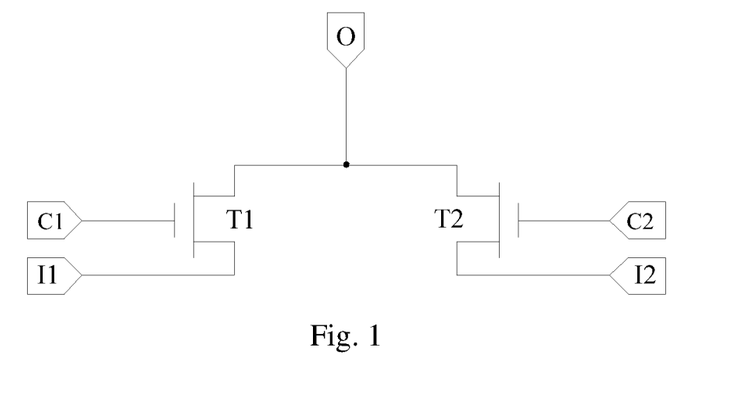
FIG. 1 is a schematic structural diagram of a reset control circuit in the related art.

FIG. 1 illustrates a reset control circuit, including a transistor T1 and a transistor T2, of a shift register circuit in a gate drive circuit in the related art, where a ratio of a width to a length (W/L) of a channel in the transistor T1 is larger than a ratio of a width to a length of a channel in the transistor T2; the transistor T1 has a first terminal connected with a first input terminal I1 of the reset control circuit, a control terminal connected with a first control terminal C1 of the reset control circuit, and a second terminal connected with an output terminal O of the reset control circuit; and the transistor T2 has a first terminal connected with a second input terminal I2 of the reset control circuit, a control terminal connected with a second control terminal C2 of the reset control circuit, and a second terminal connected with the output terminal of the reset control circuit. Here a signal to be shifted STU is input to the first control terminal C1, a shift signal STD is input to the second control terminal C2, a reset-off signal is input to the first input terminal I1, and a reset-on signal is input to the second input terminal I2.

Since the ratio of the width to the length of the channel in the transistor T1 is larger than the ratio of the width to the length of the channel in the transistor T2, when the transistor T1 is turned on by the signal to be shifted STU input to the first control terminal C1, the reset-off signal input to the first terminal of the transistor T1 shall be output at the output terminal O of the reset control circuit no matter whether the transistor T2 is turned on by the shift signal STD input to the second control terminal C2. However the ratio of the width to the length of the channel in the transistor T1 is required to be much larger than the ratio of the width to the length of the channel in the transistor T2 in the reset control circuit as illustrated in FIG. 1, and such noise interference tends to occur in a process that may result in a spike of the shift signal STD input to the second control terminal C2, so that the reset-on signal input to the first terminal of the transistor T2 is output at the output terminal O of the reset control circuit, thus interfering with the signal to be shifted STU, and resulting in an operational failure thereof. And even if the ratio of the width to the length of the channel in the transistor T1 is much larger than the ratio of the width to the length of the channel in the transistor T2, there may be some error, so that the interference of the shift signal to the signal to be shifted cannot be eliminated in effect.

Embodiments of a reset control circuit, a method for driving the same, a shift register circuit, and a display device according to the embodiments of the disclosure will be described below in details with reference to the drawings. It shall be noted that the embodiments to be described below are only a part but not all of the embodiments of the disclosure. Based upon the embodiments here of the disclosure, all the other embodiments which can occur to those ordinarily skilled in the art without any inventive effort shall fall into the scope of the disclosure.

Figure 2A:
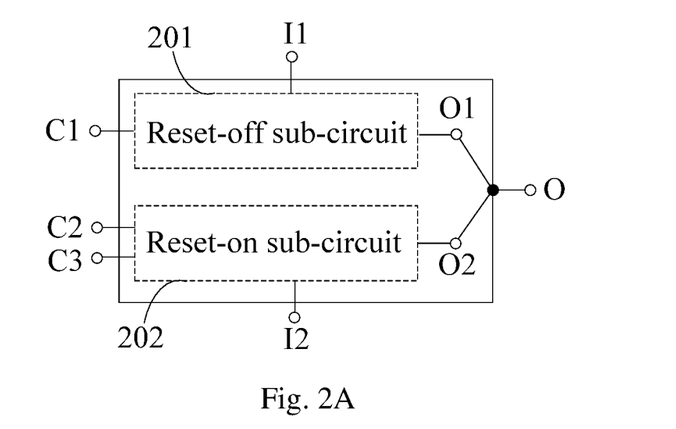
FIG. 2A to FIG. 2C are schematic structural diagrams respectively of a reset control circuit according to the embodiments of the disclosure.
Figure 2B:
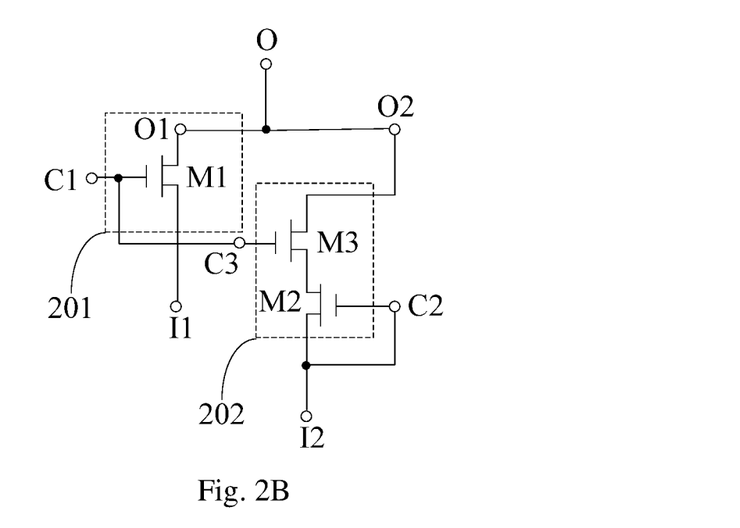
Figure 2C:
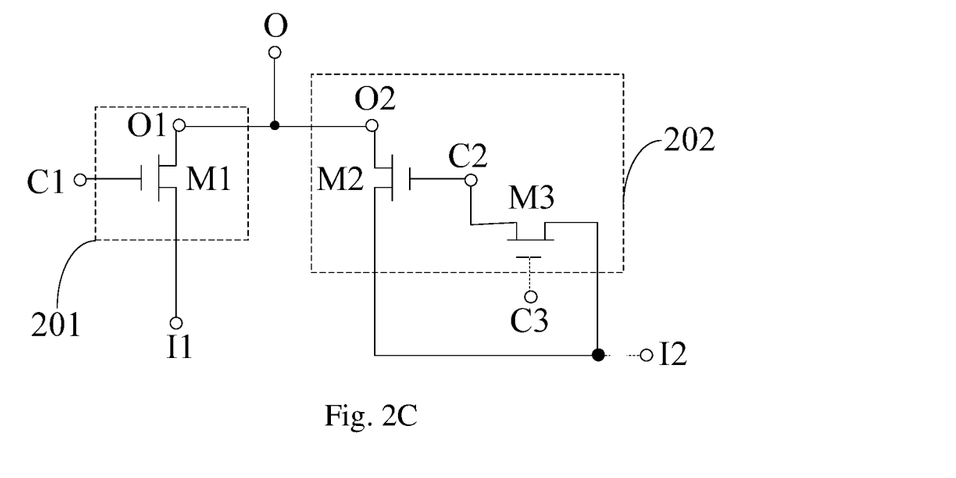

As illustrated in FIG. 2A to FIG. 2C, a reset control circuit according to the embodiments of the disclosure includes: a reset-off sub-circuit 201, a reset-on sub-circuit 202, and a general output terminal O.

The reset-off sub-circuit 201 includes a first control terminal C1, a first input terminal I1, and a first output terminal O1, and the reset-on sub-circuit 202 includes a second control terminal C2, a third control terminal C3, a second input terminal I2, and a second output terminal O2.

The first output terminal O1 and the second output terminal O2 are connected respectively with the general output terminal O, a signal to be shifted is input respectively to the first control terminal C1 and the third control terminal C3, a reset-off signal is input to the first input terminal I1, a shift signal is input to the second control terminal C2, and the shift signal reused as a reset-on signal is input to the second input terminal I2.

The reset-off sub-circuit 201 is configured to output the reset-off signal to the general output terminal O under the control of a pulse level of the signal to be shifted; and the reset-on sub-circuit 202 is configured to stop the reset-on signal from being output, under the control of the pulse level of the signal to be shifted.

In the reset control circuit above according to the embodiments of the disclosure, with the pulse level of the signal to be shifted, on one hand, the reset-off sub-circuit 201 can be controlled to be enabled to output the reset-off signal to the general output terminal O; and on the other hand, the reset-on sub-circuit 202 can be controlled to be disabled to stop the reset-on signal from being output, so that the reset-on sub-circuit 202 can be avoided from being enabled by the shift signal while the reset-off sub-circuit 201 is enabled by the signal to be shifted, to thereby eliminate in effect interference of the shift signal to the signal to be shifted.

It shall be noted that with the inventive concept of the reset control circuit above according to the embodiments of the disclosure, more than the problem of interference of a shift signal to a signal to be shifted can be addressed, and any technical solution which can eliminate interference of a signal to another signal shall fall into the scope of the disclosure as claimed.

In some embodiments, in the reset control circuit above according to the embodiments of the disclosure, the reset-off sub-circuit 201 is further configured to stop the reset-off signal from being output, under the control of a non-pulse level of the signal to be shifted; and the reset-on sub-circuit 202 is further configured to output the reset-on signal to the general output terminal O under the control of both the non-pulse level of the signal to be shifted, and a pulse level of the shift signal STD.

As can be apparent, in the reset control circuit above according to the embodiments of the disclosure, the reset-off sub-circuit 201 and the reset-on sub-circuit 202 can be controlled to be enabled separately, by controlling the level of the signal to be shifted, applied to both the reset-off sub-circuit 201 and the reset-on sub-circuit 202, and the level of the shift signal applied to only the reset-on sub-circuit 202, to thereby eliminate in effect both the interference of the shift signal to the signal to be shifted, and the interference of the signal to be shifted to the shift signal.

It shall be noted that the pulse level of the signal to be shifted, as referred to in the embodiments of the disclosure refers to a level corresponding to a pulse of the signal to be shifted. In some embodiments, if the pulse of the signal to be shifted is a positive pulse, then the pulse level of the signal to be shifted refers to a high level, and correspondingly the non-pulse level of the signal to be shifted refers to a low level; and if the pulse of the signal to be shifted is a negative pulse, then the pulse level of the signal to be shifted refers to a low level, and the non-pulse level of the signal to be shifted refers to a high level.

Alike the pulse level of the shift signal, as referred to in the embodiments of the disclosure refers to a level corresponding to a pulse of the shift signal. In some embodiments, if the pulse of the shift signal is a positive pulse, then the pulse level of the shift signal refers to a high level, and correspondingly the non-pulse level of the shift signal refers to a low level; and if the pulse of the shift signal is a negative pulse, then the pulse level of the shift signal refers to a low level, and the non-pulse level of the shift signal refers to a high level.

Furthermore in the embodiments of the disclosure, the level of the reset-off signal is opposite to the pulse level of the shift signal reused as the reset-on signal, and for example, when the level of the reset-off signal is a high level, the pulse level of the shift signal is a low level; or when the level of the reset-off signal is a low level, the pulse level of the shift signal is a high level, although the embodiments of the disclosure will not be limited thereto.

The technical solution according to the embodiments of the disclosure will be described below in details in connection with a particular embodiment thereof. It shall be noted that this embodiment is intended to better illustrate the disclosure, but not to limit the disclosure thereto. In order to better understand the technical solution according to the embodiments of the disclosure, it will be described below in details by way of an example in which the pulse of the signal to be shifted is a positive pulse, the pulse of the shift signal is a positive level, and the level of the reset-off signal is a low level.

In some embodiments, the reset control circuit above according to the embodiments of the disclosure can be implemented as follows without any limitation thereto.

As illustrated in FIG. 2B, for example, the reset-off sub-circuit 201 includes a first transistor M1, where a gate of the first transistor M1 is connected with the first control terminal C1, a drain of the first transistor M1 is connected with the first input terminal I1, and a source of the first transistor M1 is connected with the first output terminal O1. The reset-on sub-circuit 202 includes a second switch transistor M2 and a third transistor M3, where a gate of the second transistor M2 is connected with the second control terminal C2, a drain of the second transistor M2 is connected with the second input terminal I2, and a source of the second transistor M2 is connected with a drain of the third transistor M3, and a gate of the third transistor M3 is connected with the third control terminal C3, and a source of the third transistor M3 is connected with the second output terminal O2.

In the implementation as illustrated in FIG. 2B, the first transistor M1 is turned on under the control of the high level of the positive pulse of the signal to be shifted, to output the reset-off signal to the general output terminal O; and also the third transistor M3 is turned off under the control of the high level of the positive pulse of the signal to be shifted, and even if the second transistor M2 is turned on under the control of the high level of the positive pulse of the shift signal, then the reset-on signal output by the second transistor M2 will not be output to the general output terminal O through the third transistor M3 which is turned off. In this way, the interference of the shift signal to the signal to be shifted can be eliminated in effect.

Furthermore in the implementation as illustrated in FIG. 2B, the first transistor M1 can be further turned off under the control of a non-pulse low level of the signal to be shifted, to stop the reset-off signal from being output; and also the third transistor M3 is turned on under the control of the non-pulse low level of the signal to be shifted, the second transistor M2 is turned on under the high level of the positive pulse of the shift signal, and the reset-on signal output by the second transistor M2 is output to the general output terminal O through the third transistor M3.

As can be apparent from the description above, the reset-off sub-circuit 201 and the reset-on sub-circuit 202 can be controlled to be enabled separately, by controlling the level of the signal to be shifted, applied to both the first transistor M1 and the third transistor M3, and the level of the shift signal applied to only the second transistor M2, to thereby eliminate in effect both the interference of the shift signal to the signal to be shifted, and the interference of the signal to be shifted to the shift signal; and in the embodiments of the disclosure, a ratio of a width to a length of a channel in the first transistor M1 may not necessarily be much larger than a ratio of a width to a length of a channel in the second transistor M2 and a ratio of a width to a length of a channel in the third transistor M3.

As illustrated in FIG. 2C, in another example, the reset-off sub-circuit 201 includes a first transistor M1, where a gate of the first transistor M1 is connected with the first control terminal C1, a drain of the first transistor M1 is connected with the first input terminal I1, and a source of the first transistor M1 is connected with the first output terminal O1. The reset-on sub-circuit 202 includes a second transistor M2 and a third transistor M3, where a gate of the second transistor M2 is connected with a source of the third transistor M3, a drain of the second transistor M2 is connected with the second input terminal I2, and a source of the second transistor M2 is connected with the second output terminal O2, and a gate of the third switch transistor M3 is connected with the third control terminal C3, a drain of the third switch transistor M3 is connected with the second input terminal I2, and the source of the third switch transistor M3 is the second control terminal C2.

In the implementation as illustrated in FIG. 2C, the first transistor M1 is turned on under the control of the high level of the positive pulse of the signal to be shifted STU, and the reset-off signal is output to the general output terminal O; and also the third transistor M3 is turned off under the control of the high level of the positive pulse of the signal to be shifted STU, and the shift signal STD cannot be output to the second transistor M2 through the third transistor M3, that is, there is not any signal input to the gate of the second transistor M2, so that the reset-on signal input to the drain of the second transistor M2 cannot be output to the general output terminal O. In this way, the interference of the shift signal STD to the signal to be shifted STU can be eliminated in effect.

Furthermore in the implementation as illustrated in FIG. 2C, the first transistor M1 can be further turned off under the control of a non-pulse low level of the signal to be shifted STU, to stop the reset-off signal from being output; and also the third transistor M3 is turned on under the control of the non-pulse low level of the signal to be shifted STU, and the high level of the positive pulse of the shift signal STD is applied to the gate of the second transistor M2 through the third transistor M3, so that the second transistor M2 is turned on, and the reset-on signal is output to the general output terminal O through the second transistor M2.

As can be apparent from the description above, the reset-off sub-circuit 201 and the reset-on sub-circuit 202 can be controlled to be enabled separately, by controlling the level of the signal to be shifted, applied to both the first transistor M1 and the third transistor M3, and the level of the shift signal applied to only the second transistor M2, to thereby eliminate in effect both the interference of the shift signal to the signal to be shifted, and the interference of the signal to be shifted to the shift signal; and in the embodiments of the disclosure, the ratio of the width to the length of the channel in the first transistor M1 may not necessarily be much larger than the ratio of the width to the length of the channel in the second transistor M2 and the ratio of the width to the length of the channel in the third transistor M3.

The structure of the reset control circuit above according to the embodiments of the disclosure has been described above only by way of an example, and the structure of the reset control circuit will not be limited to the structure above according to the embodiments of the disclosure, but can be another structure readily occurring to those skilled in the art, and the embodiments of the disclosure will not be limited thereto.

Based upon the same inventive concept, the embodiments of the disclosure further provide a method for driving the reset control circuit above, and since the driving method addresses the problem under a similar principle to the principle under which the reset control circuit above addresses the problem, reference can be made to the implementation of the reset control circuit above according to the embodiments of the disclosure for an implementation of the driving method according to the embodiments of the disclosure, so a repeated description thereof will be omitted here.

Figure 3:
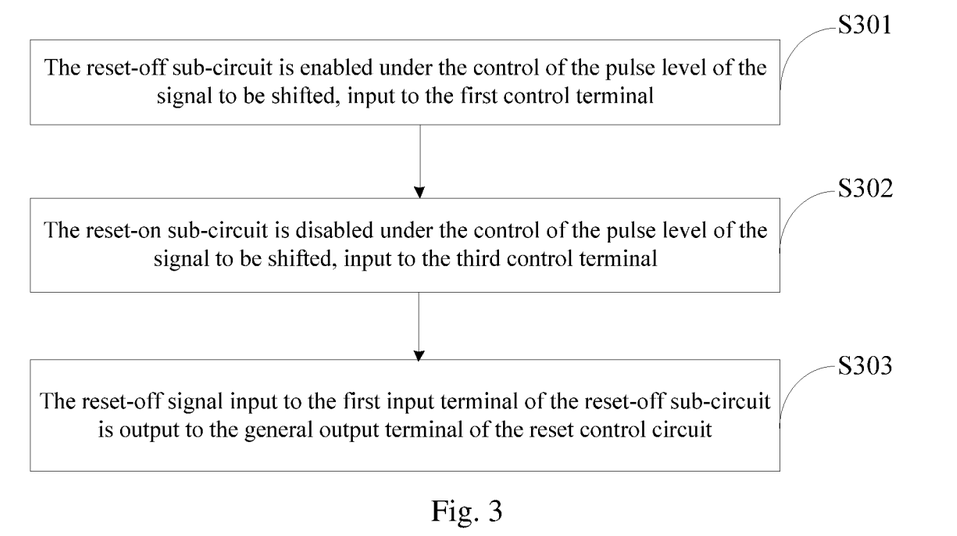
FIG. 3 is a schematic flow chart of a method for driving a reset control circuit according to the embodiments of the disclosure.

In the method above for driving the reset control circuit according to the embodiments of the disclosure, the signal to be shifted can be enabled so that the reset-off signal is output, in the following operations as illustrated in FIG. 3.

S301. The reset-off sub-circuit is enabled under the control of the pulse level of the signal to be shifted, input to the first control terminal.

S302. The reset-on sub-circuit is disabled under the control of the pulse level of the signal to be shifted, input to the third control terminal.

S303. The reset-off signal input to the first input terminal of the reset-off sub-circuit is output to the general output terminal of the reset control circuit.

It shall be noted that, in the method above for driving the reset control circuit according to the embodiments of the disclosure, firstly the operation S301 and then the operation S302 can be performed, or firstly the operation S302 and then the operation S301 can be performed, or the operation S301 and the operation S302 can be performed at the same time, although the embodiments of the disclosure will not be limited thereto.

In some embodiments, in the method above for driving the reset control circuit according to the embodiments of the disclosure, the shift signal can be enabled so that the reset-on signal is output, in the following operations.

The reset-off sub-circuit is disabled under the control of a non-pulse level of the signal to be shifted, input to the first control terminal.

The reset-on sub-circuit is enabled under the control of both a pulse level of the shift signal input to the second control terminal, and the non-pulse level of the signal to be shifted, input to the third control terminal.

The reset-on signal input to the second input terminal of the reset-on sub-circuit is output to the general output terminal of the reset control circuit.

Based upon the same inventive concept, the embodiments of the disclosure further provide a shift register circuit including the reset control circuit above, and since the shift register circuit addresses the problem under a similar principle to the principle under which the reset control circuit above addresses the problem, reference can be made to the implementation of the reset control circuit above according to the embodiments of the disclosure for an implementation of the shift register circuit according to the embodiments of the disclosure, so a repeated description thereof will be omitted here.

Figure 4A:
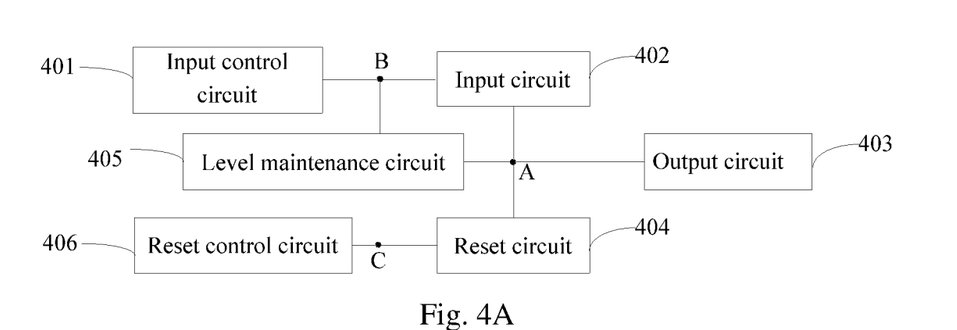
FIG. 4A and FIG. 4B are schematic structural diagrams respectively of a shift register circuit according to the embodiments of the disclosure.

As illustrated in FIG. 4A, the shift register circuit according to the embodiments of the disclosure includes an input control circuit 401, an input circuit 402, an output circuit 403, a reset circuit 404, a level maintenance circuit 405, and the reset control circuit above 406, where: the input circuit 402 is configured to set a reset node A to an output-on signal under the control of the input control circuit 401 to enable the output circuit 403; the reset circuit 404 is configured to set the reset node A to an output-off signal under the control of the reset control circuit 406 to disable the output circuit 403; and the level maintenance circuit 405 is configured to maintain a level at a node B where the input control circuit 401 is connected with the input circuit 403 when both the input circuit 402 and the reset circuit 404 are disabled. And in some embodiments, the level maintenance circuit 405 includes a capacitor.

Figure 4B:
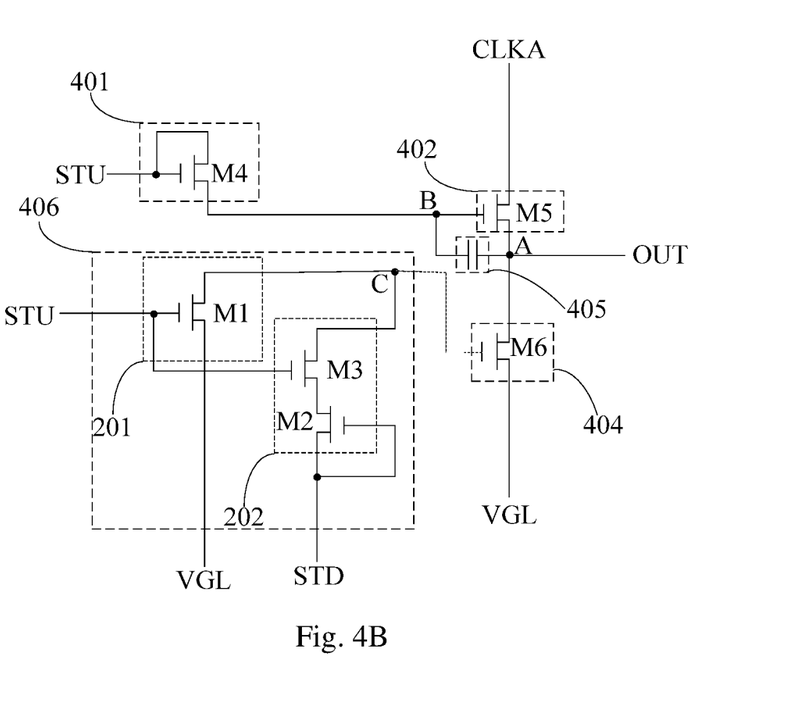

In some embodiments, in the shift register circuit above according to the embodiments of the disclosure, as illustrated in FIG. 4B, the input control circuit 401 includes a fourth transistor M4, and the input circuit 402 includes a fifth transistor M5, where a source of the fourth transistor M4 is connected with the connection node B, and a gate and a drain of the fourth transistor M4 are input with the signal to be shifted STU respectively. And a gate of the fifth transistor M5 is connected with the connection node B, a drain of the fifth transistor M5 is input with a clock signal CLKA at the same level as the level of the output-on signal, and a source of the fifth transistor M5 is connected with the reset node A. In some embodiments, the fourth switch transistor M4 is turned on under the control of a high level of a positive pulse of the shift signal STU, a signal at the high level of the positive pulse of the shift signal STU is output to the gate of the fifth transistor M5 through the fourth transistor M4 to control the fifth transistor M5 to be turned on, and the clock signal CLKA which is used as the output-on signal is output to the reset node A to enable the output circuit 403 (not illustrated in FIG. 4B). Of course, the fourth transistor M4 and the fifth transistor M5 can alternatively be configured as N-type transistors according to different signals input thereto, although the embodiments of the disclosure will not be limited thereto.

It shall be noted that in the shift register circuit above according to the embodiments of the disclosure, the input control circuit 401 can alternatively be the same as an input control circuit of the shift register circuit in the related art, and both of them refer to a circuit configured to control the input circuit 402 to provide the output-on signal. The input circuit 402 can alternatively be the same as an input circuit of the shift register circuit in the related art, and both of them refer to a circuit configured to provide the output-on signal. In a practical application, a control terminal of the input circuit 402 is connected with an output terminal of the input control circuit 401 via the connection node B, and an output terminal of the input circuit 402 is connected with the reset node A, so that the reset node A is set to the output-on signal for enabling the output circuit 403, under the control of a control signal output by the input control circuit 401.

In some embodiments, in the shift register circuit above according to the embodiments of the disclosure, the reset circuit 404 includes a sixth transistor M6, where a gate of the sixth transistor M6 is connected with the general output terminal O of the reset control circuit 406 via a node C, a drain of the sixth transistor M6 is input with a low-level signal VGL, and a source of the sixth transistor M6 is connected with the reset node A. The sixth transistor M6 sets the reset node A to the low-level signal VGL which is used as the output-off signal, upon reception of the reset-on signal.

It shall be noted that in the shift register circuit above according to the embodiments of the disclosure, the reset circuit 404 can alternatively be the same as a reset circuit in the related art, and both of which refer to a circuit configured to reset the reset node A; and in some embodiments, the output-off signal for disabling the output circuit 403 can be input to the input terminal of the reset circuit 404, and the reset circuit 404 enabled by the reset-on signal outputs the output-off signal to the reset node A, so that the reset node A is set to the output-off signal.

Furthermore in the shift register circuit above according to the embodiments of the disclosure, the output circuit 403 can alternatively be the same as an output circuit of the shift register circuit in the related art, and both of which refer to a circuit for outputting the shift signal; and in some embodiments, the clock signal is typically input to the input terminal of the output circuit 403, and when the reset node A is set to a level for enabling the output circuit 403, and a segment of the clock signal is picked off and output as the shift signal. Thereafter when the reset node A is reset, the output circuit 403 is disabled from outputting the clock signal. Of course, in a practical application, the output circuit 403 can alternatively be another circuit for outputting the shift signal, although the embodiments of the disclosure will not be limited thereto.

Figure 5:
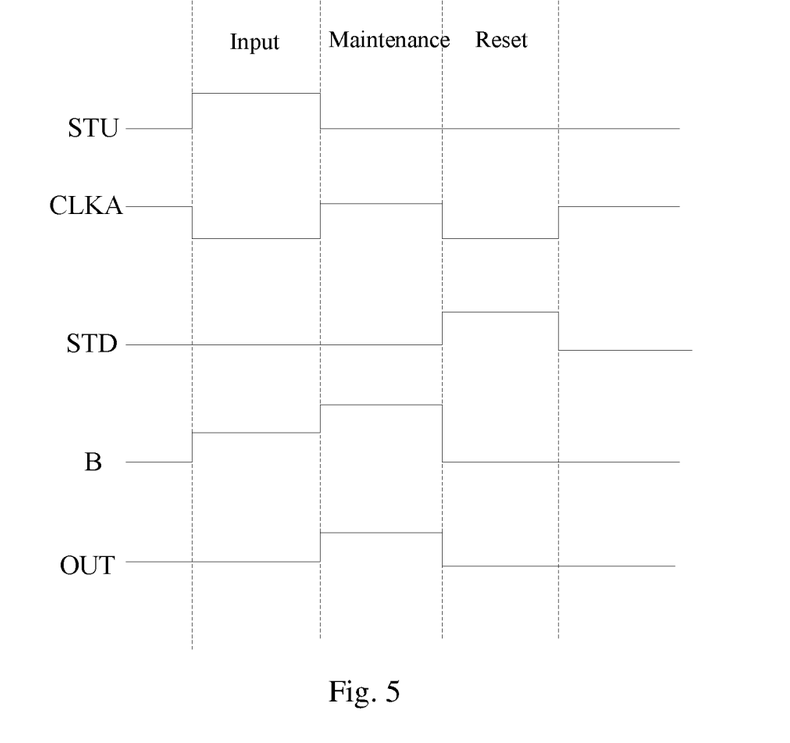
FIG. 5 is a time sequence diagram of the shift register circuit as illustrated in FIG. 4B in operation.

For the shift register circuit above according to the embodiments of the disclosure, which includes the reset control circuit as illustrated in FIG. 2B, FIG. 5 illustrates a corresponding time sequence diagram according to the embodiments of the disclosure in operation.

In an input phase, the signal to be shifted STU is at a high level, the shift signal STD is at a low level, and the clock signal CLKA is at a low level.

The first transistor M1, the fourth transistor M4, and the fifth transistor M5 are turned on, and the second transistor M2, the third transistor M3, and the sixth transistor M6 are turned off; and the connection node B is at a high potential, the low-level signal VGL which is used as the reset-off signal is output to the node C, the node C is at a low potential, the clock signal CLKA for enabling the output circuit (not illustrated in FIG. 4B) is output to the reset node A, the reset node A is at a high potential, and the clock signal CLKA is output at the output terminal OUT.

In a maintenance phase, the signal to be shifted STU is at a low level, the shift signal STD is at a low level, and the clock signal CLKA is at a high level.

The first transistor M1, the second transistor M2, the fourth transistor M4, and the sixth transistor M6 are turned off, and the third transistor M3 and the fifth transistor M5 are turned on; and the connection node B remains at a high potential due to the capacitor, the clock signal CLKA is output to the reset node A, the reset node A is at a high potential, and the clock signal CLKA is output at the output terminal OUT.

In a reset phase, the signal to be shifted STU is at a low level, the shift signal STD is at a high level, and the clock signal CLKA is at a low level.

The first transistor M1, the fourth transistor M4, and the fifth transistor M5 are turned off, and the second transistor M2, the third transistor M3, and the sixth transistor M6 are turned on; and the node C is at a high potential, the reset node A is pulled down to a low level, and the low-level signal VGL which is used as the output-off signal is output at the output terminal OUT.

Based upon the same inventive concept, the embodiments of the disclosure further provide a display device including the shift register circuit above according to the embodiments of the disclosure, and the display device can be a mobile phone, a tablet computer, a TV set, a monitor, a notebook computer, a digital photo frame, a navigator, a smart watch, a fitness wrist band, a personal digital assistant, or any other product or component with a display function. Reference can be made to the embodiments of the shift register circuit above for an implementation of the display device, so a repeated description thereof will be omitted here.

The embodiments of the disclosure provide the reset control circuit, the method for driving the same, the shift register circuit, and the display device, the reset control circuit includes: a reset-off sub-circuit, a reset-on sub-circuit, and a general output terminal, where the reset-off sub-circuit includes a first control terminal, a first input terminal, and a first output terminal, and the reset-on sub-circuit includes a second control terminal, a third control terminal, a second input terminal, and a second output terminal; the first output terminal and the second output terminal are connected respectively with the general output terminal, a signal to be shifted is input respectively to the first control terminal and the third control terminal, a reset-off signal is input to the first input terminal, a shift signal is input to the second control terminal, and the shift signal reused as a reset-on signal is input to the second input terminal; the reset-off sub-circuit is configured to output the reset-off signal to the general output terminal under the control of a pulse level of the signal to be shifted; and the reset-on sub-circuit is configured to stop the reset-on signal from being output, under the control of the pulse level of the signal to be shifted. With the pulse level of the signal to be shifted, on one hand, the reset-off sub-circuit can be controlled to be enabled to output the reset-off signal to the general output terminal; and on the other hand, the reset-on sub-circuit can be controlled to be disabled to stop the reset-on signal from being output, so that the reset-on sub-circuit can be avoided from being enabled by the shift signal while the reset-off sub-circuit is enabled by the signal to be shifted, to thereby eliminate in effect interference of the shift signal to the signal to be shifted.

It shall be noted that the relationship terms, e.g., the first, the second, etc., in this context are merely intended to distinguish one entity or operation from another entity or operation, but may not necessarily require or suggest any real relationship or order between these entities or operations.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A reset control circuit, comprising: a reset-off sub-circuit, a reset-on sub-circuit, and a general output terminal, wherein:
   the reset-off sub-circuit comprises a first control terminal, a first input terminal, and a first output terminal, and the reset-on sub-circuit comprises a second control terminal, a third control terminal, a second input terminal, and a second output terminal;
   the first output terminal and the second output terminal are connected respectively with the general output terminal, a signal to be shifted is input respectively to the first control terminal and the third control terminal, a reset-off signal is input to the first input terminal, a shift signal is input to the second control terminal, and the shift signal reused as a reset-on signal is input to the second input terminal;
   the reset-off sub-circuit is configured to output the reset-off signal to the general output terminal under control of a pulse level of the signal to be shifted; and
   the reset-on sub-circuit is configured to stop the reset-on signal from being output, under the control of the pulse level of the signal to be shifted;
   wherein the reset-off sub-circuit comprises a first transistor; wherein a gate of the first transistor is connected with the first control terminal, a drain of the first transistor is connected with the first input terminal, and a source of the first transistor is connected with the first output terminal;
   wherein the reset-on sub-circuit comprises a second transistor and a third transistor; wherein a gate of the second transistor is connected with a source of the third transistor, a drain of the second transistor is connected with the second input terminal, and a source of the second transistor is connected with the second output terminal, and a gate of the third transistor is connected with the third control terminal, a drain of the third transistor is connected with the second input terminal, and the source of the third transistor is the second control terminal.

2. The reset control circuit according to claim 1, wherein the reset-off sub-circuit is further configured to stop the reset-off signal from being output, under control of a non-pulse level of the signal to be shifted.

3. The reset control circuit according to claim 1, wherein the reset-on sub-circuit is further configured to output the reset-on signal to the general output terminal under control of both a non-pulse level of the signal to be shifted, and a pulse level of the shift signal.

4. A method for driving the reset control circuit according to claim 1, the method comprising:
   enabling the reset-off sub-circuit under the control of the pulse level of the signal to be shifted, input to the first control terminal;
   disabling the reset-on sub-circuit under the control of the pulse level of the signal to be shifted, input to the third control terminal; and
   outputting the reset-off signal input to the first input terminal of the reset-off sub-circuit to the general output terminal of the reset control circuit.

5. The method according to claim 4, wherein the method further comprises:
   disabling the reset-off sub-circuit under control of a non-pulse level of the signal to be shifted, input to the first control terminal;
   enabling the reset-on sub-circuit under control of both a pulse level of the shift signal input to the second control terminal, and the non-pulse level of the signal to be shifted, input to the third control terminal; and
   outputting the reset-on signal input to the second input terminal of the reset-on sub-circuit to the general output terminal of the reset control circuit.

6. A shift register circuit, comprising: an input control circuit, an input circuit, an output circuit, a reset circuit, a level maintenance circuit, and a reset control circuit, wherein:
   the input circuit is configured to set a reset node to an output-on signal under control of the input control circuit to enable the output circuit;

the reset circuit is configured to set the reset node to an output-off signal under control of the reset control circuit to disable the output circuit; and the level maintenance circuit is configured to maintain a level at a node where the input control circuit is connected with the input circuit when both the input circuit and the reset circuit are disabled;

wherein the reset control circuit comprises a reset-off sub-circuit, a reset-on sub-circuit, and a general output terminal, wherein:

the reset-off sub-circuit comprises a first control terminal, a first input terminal, and a first output terminal, and the reset-on sub-circuit comprises a second control terminal, a third control terminal, a second input terminal, and a second output terminal;

the first output terminal and the second output terminal are connected respectively with the general output terminal, a signal to be shifted is input respectively to the first control terminal and the third control terminal, a reset-off signal is input to the first input terminal, a shift signal is input to the second control terminal, and the shift signal reused as a reset-on signal is input to the second input terminal;

the reset-off sub-circuit is configured to output the reset-off signal to the general output terminal under control of a pulse level of the signal to be shifted; and the reset-on sub-circuit is configured to stop the reset-on signal from being output, under the control of the pulse level of the signal to be shifted;

wherein the reset-off sub-circuit comprises a first transistor; wherein a gate of the first transistor is connected with the first control terminal, a drain of the first transistor is connected with the first input terminal, and a source of the first transistor is connected with the first output terminal;

wherein the reset-on sub-circuit comprises a second transistor and a third transistor; wherein a gate of the second transistor is connected with a source of the third transistor, a drain of the second transistor is connected with the second input terminal, and a source of the second transistor is connected with the second output terminal, and a gate of the third transistor is connected with the third control terminal, a drain of the third transistor is connected with the second input terminal, and the source of the third transistor is the second control terminal.

7. The shift register circuit according to claim 6, wherein the reset-off sub-circuit is further configured to stop the reset-off signal from being output, under control of a non-pulse level of the signal to be shifted.

8. The shift register circuit according to claim 6, wherein the reset-on sub-circuit is further configured to output the reset-on signal to the general output terminal under control of both a non-pulse level of the signal to be shifted, and a pulse level of the shift signal.

9. A display device, comprising the shift register circuit according to claim 6.

* * * * *